(12) United States Patent
Autry

(10) Patent No.: US 8,274,164 B2
(45) Date of Patent: Sep. 25, 2012

(54) LESS EXPENSIVE HIGH POWER PLASTIC SURFACE MOUNT PACKAGE

(75) Inventor: Tracy Autry, Trabuco Canyon, CA (US)

(73) Assignee: Microsemi Corporation, Irvine, CA (US)

( * ) Notice: Subject to any disclaimer, the term of this patent is extended or adjusted under 35 U.S.C. 154(b) by 0 days.

(21) Appl. No.: 12/590,377

(22) Filed: Nov. 6, 2009

(65) Prior Publication Data

US 2010/0109147 A1    May 6, 2010

Related U.S. Application Data

(60) Provisional application No. 61/198,478, filed on Nov. 6, 2008.

(51) Int. Cl.
*H01L 23/28* (2006.01)

(52) U.S. Cl. . 257/796; 257/692; 257/706; 257/E21.509; 257/E23.023; 438/122; 438/123

(58) Field of Classification Search ............ 257/796
See application file for complete search history.

(56) References Cited

U.S. PATENT DOCUMENTS

| 6,777,800 B2 * | 8/2004 | Madrid et al. ............ 257/690 |
| 2003/0052408 A1 * | 3/2003 | Quinones et al. ............ 257/737 |
| 2009/0015978 A1 * | 1/2009 | Clark ............................ 361/111 |

* cited by examiner

*Primary Examiner* — Marcos D. Pizarro
*Assistant Examiner* — Eva Yan Montalvo
(74) *Attorney, Agent, or Firm* — Marger Johnson & McCollom, PC

(57) ABSTRACT

A high power surface mount package including a thick bond line of solder interposed between the die and a heatsink, and between the die and a lead frame, wherein the lead frame has the same coefficient of thermal expansion as the heatsink. In one preferred embodiment, the heatsink and the lead frame are comprised of the same material. The package can be assembled using standard automated equipment, and does not require a weight or clip to force the parts close together, which force typically reduces the solder bond line thickness. Advantageously, the thermal stresses on each side of the die are effectively balanced, allowing for a large surface area die to be packaged with conventional and less expensive materials. One type of die that benefits from the present invention can include a transient voltage suppressor, but could include other dies generating a significant amount of heat, such as those in excess of 0.200 inches square.

13 Claims, 2 Drawing Sheets

LESS EXPENSIVE HIGH POWER PLASTIC SURFACE MOUNT PACKAGE

CLAIM OF PRIORITY

This application claims priority of U.S. Provisional Ser. No. 61/198,478 filed Nov. 6, 2008, entitled "Less Expensive High Power Plastic Surface Mount Package", the teachings of which are incorporated herein by reference.

FIELD OF THE INVENTION

The present invention is generally related to semiconductor packages, and more particularly to large area high power dies having thermal cooling.

BACKGROUND OF THE INVENTION

Semiconductor packages typically comprise an enclosed die that generates a certain amount of heat during operation. Some semiconductor dies are high power devices that generate a significant amount of heat, such as transient voltage suppressors. Cooling devices are often employed to facilitate the dissipation of thermal heat, such as heatsinks and the like. Typically, the semiconductor die is mechanically and thermally coupled to the heatsink, and may be joined thereto by a thin solder bond line.

Semiconductor die typically have a low coefficient of thermal expansion, such as silicon die. In contrast, heatsinks typically have a high thermal coefficient of thermal expansion as they typically comprise of metal materials. Thus, the materials expand at different rates as a function of temperature during operation which can crack and damage the die over varying operating temperatures. It is conventional in the industry to implement more expensive materials to thermally match and join the die to the high coefficient of thermal expansion materials. Typically, these thermal matching materials are interposed between the die and the thermal cooling member, such as the heatsink.

There is desired a less expensive high power surface mount package that eliminates the need for expensive thermal matching materials, and particularly a large surface area die having large surface areas.

SUMMARY OF INVENTION

The present invention achieves technical advantages as a high power surface mount package including a thick bond line of solder interposed between the die and a heatsink, and between the die and a lead frame, wherein the lead frame has the same coefficient of thermal expansion as the heatsink. In one preferred embodiment, the heatsink and the lead frame are comprised of the same material. The package can be assembled using standard automated equipment, and does not require a weight or clip to force the parts close together, which force typically reduces the solder bond line thickness. Advantageously, the thermal stresses on each side of the die are effectively balanced to prevent damage to the die over temperature cycles, allowing for a large surface area die to be packaged with conventional and inexpensive materials. One type of die that benefits from the present invention can include a transient voltage suppressor, but could include other dies generating a significant amount of heat, such as those in excess of 0.200 inches square.

DETAILED DESCRIPTION OF THE PREFERRED EMBODIMENT

Figure 1:
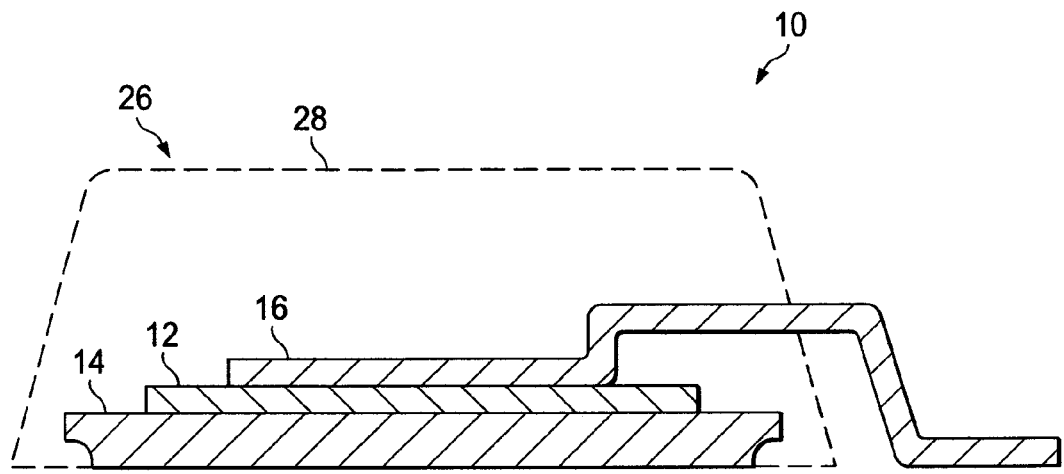
FIG. 1 is a side elevational view of a large area high power semiconductor die package according to one preferred embodiment of the present invention.

Referring now to FIG. 1 there is generally shown at 10 a high power surface mount package according to one preferred embodiment of the present invention. Package 10 is seen to comprise a large surface area die 12 interposed between a large heatsink 14 and a lead frame 16 in a sandwich-like configuration.

Figure 2:
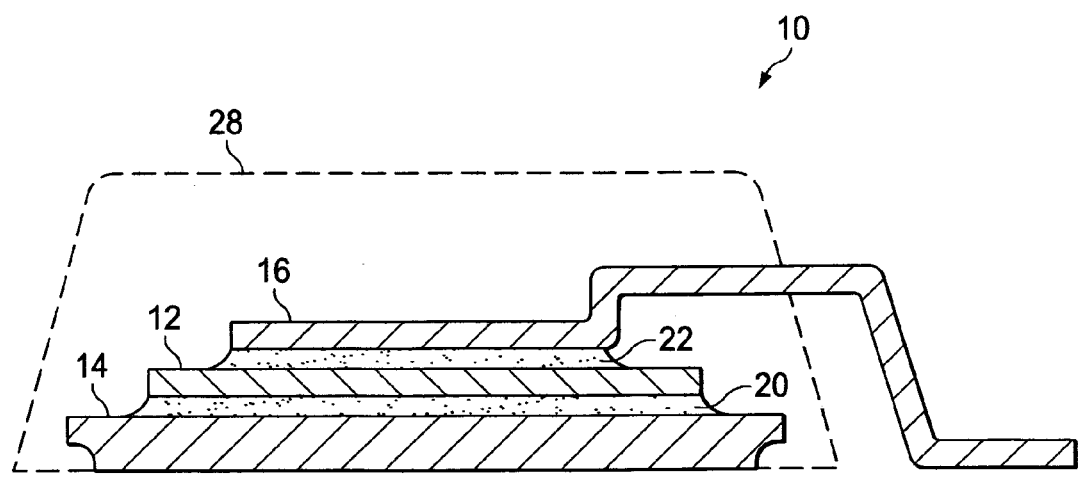
FIG. 2 is an side sectional view taken vertically thru the package of FIG. 1, illustrating the thick solder bond lines disposed between the die and the respective heatsink and lead frame.

Referring to FIG. 2 there is shown an enlarged side sectional view of the package 10 shown in FIG. 1. Advantageously, a relatively thick solder bond line 20 is disposed between the lower major surface of the large die 12 and heatsink 14. In addition, a relatively thick solder bond line 22 is formed between the top major surface of the die 12 and the lead frame 16 thereabove, as shown. According to one aspect of the present invention, the heatsink 14 and the lead frame 16 have substantially the same coefficient of thermal expansion. In another aspect of the present invention, the heatsink 12 and the lead frame 16 are comprised of the same materials, and thus have the same coefficient of thermal expansion. In one preferred embodiment both the heatsink and the lead frame are comprised of copper, although limitation to this material is not to be inferred.

The thicknesses of the solder bond lines 20 and 22 are relatively thick and thus provide additional mechanical support to the die 12 to prevent flexing. The thickness of these solder bond lines 20 and 22 are preferably at least 0.005 inches thickness, although this thickness could be greater than or less than this thickness as desired, such as 0.001 inches or even 0.010 inches or greater, depending on the designed parameters, expected temperature cycles for intended operation of the die, and the choice of materials for the heatsink 14 and lead frame 16. These solder bond lines are easily formed during manufacture by eliminating a weight or clipping force of the package during heating to melt/re-flow the solder materials. It is noted that the thickness of the solder bond lines 20 and 22 are exaggerated in FIG. 2 for purposes of illustration.

Advantageously, matching the coefficient of thermal expansion of the heatsink 14 to the lead frame 16 balances any residual mechanical stress to the large surface area die 12 due to any thermal expansion mismatch. Preferably, the thick solder bond lines 20 and 22 are comprised of very common inexpensive materials, such as a Pb/Tin solder paste. In one preferred embodiment, the solder paste may have a melting point of 280° Celsius and is re-flowed at 300° Celsius. Solder paste comprised of 88Pb10Sn2Ag has been found to be suitable, and limitation to this material is not to be inferred.

A typical die size may be 0.200 inches square or greater, and may have a surface area of 0.210 inches square in one preferred embodiment, and have a thickness of 0.012 inches. In one preferred embodiment, the semiconductor may be a diode, such as a transient voltage suppressor suitable for use in an automotive application.

METHOD OF MANUFACTURE

Figure 3:
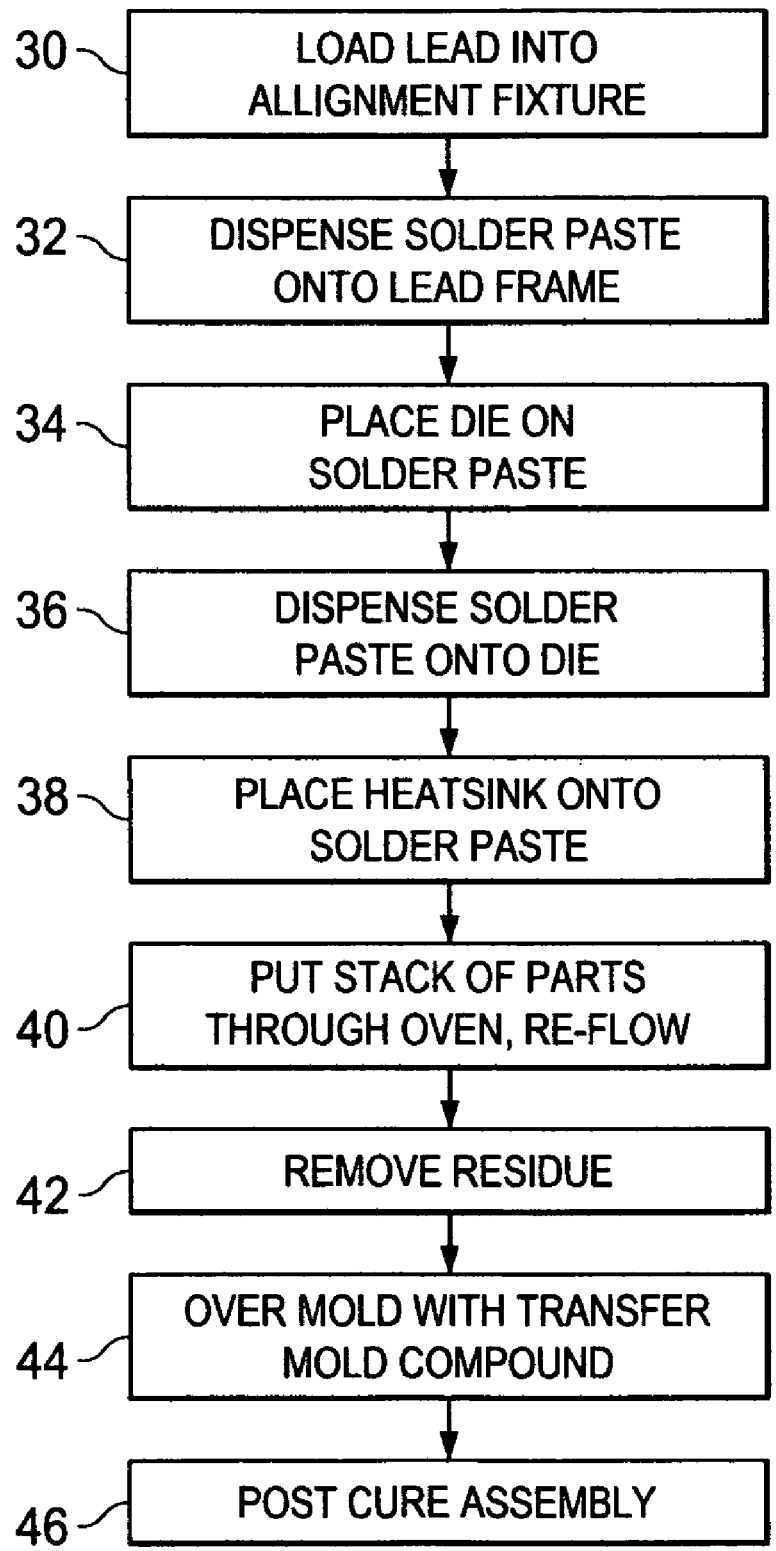
FIG. 3 is a flow diagram of an assembly process according to one preferred embodiment of the present invention.

Referring to FIG. 3 in view of FIG. 2, one preferred method for packaging the present invention is shown.

At Step 30, the lead frame 16 is loaded into an alignment fixture (not shown).

At step 32, a solder paste corresponding to solder bond line 22 is dispensed onto the lead frame 16, such as a Pb/Tin solder as previously described.

At step 34, the die 12 is placed onto the solder paste of step 32.

At step 36 solder paste is dispensed onto the die 12, which may also be an inexpensive conventional Pb/Tin solder having the same or similar thickness as the solder paste dispensed in step 32. The width of the solder paste may differ from that of step 32, depending on the length/width of the die and the dimensions of the lead frame 16.

At step 38, the heatsink 14 is placed on the solder paste dispensed in step 36.

Preferably, the lead frame 16 and heatsink 14 are comprised of the same material, such as copper, as previously described.

At step 40, the stack of parts from steps 30, 32, 34, 36 and 38 are put thru a 300° Celsius oven to re-flow the solder paste and advantageously form the thick solder bond lines 20 and 22. Advantageously, the stack of parts are not provided with a weight or clip to force the piece parts closed together during solder re-flow, which would otherwise reduce the thickness of the solder bond lines 20 and 22. It is noted that other methods can be used to control the bond line thickness as desired.

At step 42 the parts are cleaned to remove residue from the solder paste created during the re-flow solder.

At step 44, the sub-assembly is over molded with a transfer mold compound, shown in phantom lines, which may comprise of plastic, but could also comprise of ceramic or other materials as desired.

At step 46, the assembly is post cured in an oven at 175° Celsius for about 1 hour to complete curing the mold compound.

Though the invention has been described with respect to a specific preferred embodiment, many variations and modifications will become apparent to those skilled in the art upon reading the present application. The intention is therefore that the appended claims be interpreted as broadly as possible in view of the prior art to include all such variations and modifications.

What is claimed is:

1. A semiconductor package, comprising:
    a semiconductor die having a first major surface and a second major surface, wherein the semiconductor die includes a transient voltage suppressor;
    a lead frame having a first coefficient of thermal expansion;
    a first solder material having a first thickness and disposed continuously between the semiconductor die first major surface and the lead frame, wherein the first solder material has a thickness within the range of 0.005 to 0.01 inches;
    a heatsink having a second coefficient of thermal expansion;
    a second solder material having a second thickness and disposed continuously between the semiconductor die second major surface and the heatsink, wherein the second solder material has a thickness within the range of 0.005 to 0.01 inches;
    wherein the first coefficient of thermal expansion and the second coefficient of thermal expansion are substantially the same.

2. The semiconductor package as specified in claim 1 wherein the lead frame and the heatsink include the same material.

3. The semiconductor package as specified in claim 1 wherein the first coefficient of thermal expansion and the second coefficient of thermal expansion are the same.

4. The semiconductor package as specified in claim 1 wherein the first and second solder materials each have a coefficient of thermal expansion that are substantially the same.

5. The semiconductor package as specified in claim 4 wherein the first and second solder materials include the same material.

6. The semiconductor package as specified in claim 4 wherein at least the first solder material or the second solder material includes lead and tin.

7. The semiconductor package as specified in claim 6 wherein both the first solder material and the second solder material include 88Pb10Sn2Ag solder.

8. The semiconductor package as specified in claim 1, wherein the first thickness of the first solder material and the second thickness of the second solder material are substantially the same.

9. A semiconductor package comprising:
    a semiconductor die having a first major surface and a second major surface, wherein the semiconductor die includes a transient voltage suppressor;
    a lead frame having a first coefficient of thermal expansion;
    a first solder material having a first thickness and disposed continuously between the semiconductor die first major surface and the lead frame, wherein the first solder material has a thickness of at least 0.005 inches;
    a heatsink having a second coefficient of thermal expansion;
    a second solder material having a second thickness and disposed continuously between the semiconductor die second major surface and the heatsink, wherein the second solder material has a thickness of at least 0.005 inches;
    wherein the first coefficient of thermal expansion and the second coefficient of thermal expansion are substantially the same.

10. The semiconductor package as specified in claim 9, wherein the first thickness of the first solder material and the second thickness of the second solder material are substantially the same.

11. The semiconductor package of claim 10, wherein the first and second solder materials each have a coefficient of thermal expansion that are substantially the same.

12. The semiconductor package of claim 10, wherein at least the first solder material or the second solder material includes lead and tin.

13. The semiconductor package of claim 12, wherein both the first solder material and the second solder material include 88Pb10Sn2Ag solder.

* * * * *

UNITED STATES PATENT AND TRADEMARK OFFICE
CERTIFICATE OF CORRECTION

PATENT NO. : 8,274,164 B2
APPLICATION NO. : 12/590377
DATED : September 25, 2012
INVENTOR(S) : Tracy Autry Page 1 of 1

It is certified that error appears in the above-identified patent and that said Letters Patent is hereby corrected as shown below:

On the Title page of the patent, under (56) References Cited, U.S. PATENT DOCUMENTS, insert the following patent citation:

--6,800,932   B2   10/05/2004   Lam et al.--

Signed and Sealed this
Twenty-third Day of April, 2013

Teresa Stanek Rea
*Acting Director of the United States Patent and Trademark Office*